United States Patent
Vail et al.

(10) Patent No.: US 6,813,300 B2
(45) Date of Patent: Nov. 2, 2004

(54) ALIGNMENT OF AN ON CHIP MODULATOR

(75) Inventors: Edward C. Vail, Fremont, CA (US);
Bardia Pezeshki, Redwood City, CA (US); Gideon Yoffe, Fremont, CA (US);
Mark Emanuel, Fremont, CA (US)

(73) Assignee: Santur Corporation, Fremont, CA (US)

( * ) Notice: Subject to any disclaimer, the term of this patent is extended or adjusted under 35 U.S.C. 154(b) by 0 days.

(21) Appl. No.: 10/114,747

(22) Filed: Apr. 1, 2002

(65) Prior Publication Data

US 2002/0154666 A1 Oct. 24, 2002

Related U.S. Application Data

(60) Provisional application No. 60/280,207, filed on Mar. 30, 2001.

(51) Int. Cl.[7] .................................................. H01S 5/00
(52) U.S. Cl. ............................................ 372/50; 372/26
(58) Field of Search ................................ 372/52, 5, 26, 372/46, 22, 32, 50, 9, 19; 385/2, 52, 91; 398/92, 201

(56) References Cited

U.S. PATENT DOCUMENTS

| | | | |
|---|---|---|---|
| 4,009,385 A | 2/1977 | Sell | 372/38.07 |
| 4,317,611 A | 3/1982 | Petersen | |
| 4,359,773 A | 11/1982 | Swartz et al. | |
| 4,498,730 A | 2/1985 | Tanaka et al. | |
| 4,796,266 A | 1/1989 | Banwell et al. | 372/29.021 |
| 4,866,699 A * | 9/1989 | Brackett et al. | 398/78 |
| 5,002,349 A * | 3/1991 | Cheung et al. | 385/1 |
| 5,132,824 A * | 7/1992 | Patel et al. | 349/1 |
| 5,136,598 A | 8/1992 | Weller et al. | |
| 5,274,489 A | 12/1993 | Smith et al. | |
| 5,283,796 A | 2/1994 | Fink | |
| 5,291,502 A | 3/1994 | Pezeshki et al. | |
| 5,977,567 A | 11/1999 | Verdiell | |
| 5,978,402 A | 11/1999 | Matsumoto et al. | |
| 5,993,544 A | 11/1999 | Knauss et al. | 117/94 |

(List continued on next page.)

FOREIGN PATENT DOCUMENTS

| | | |
|---|---|---|
| FR | 2805092 | 8/2001 |
| WO | WO 02/13343 A2 | 2/2002 |
| WO | WO 02/37069 A1 | 5/2002 |
| WO | WO 02/37621 A2 | 5/2002 |
| WO | WO 02/058197 A2 | 7/2002 |
| WO | WO 02/013343 A3 | 7/2003 |

OTHER PUBLICATIONS

"Broadband Lightwave Sources and System", Gayton Photonics Ltd., http://www.infowin.org/ACTS/RUS/PROJECTS/ac065.htm, printed Oct. 17, 2000 (4 pages).
Dellunde, Jaume, "Laser diodes", http://www.geocites.com/jdellund/receng.htm, printed Aug. 8, 2001 (4 pages).
Hunter, D.K., et al., "Guided wave optical switch architectures. Part 1. Space switching", International Journal of Optoelectronics, vol. 9, No. 6, 1994 (pp. 477–487).
Solgaard, O., et al., "Optoelectronic Packaging Using Silicon Surface–Micromachined Alignment Mirrors", IEEE Photonics Technology Letters, vol. 7, No. 1, 1995 (pp. 41–43) (4 pages total).
Li, G.P., et al., "16–Wavelength Gain–Coupled DFB Laser Array with Fine Tunability", IEEE Photonics Technology Letters, vol. 8, No. 1, Jan. 1996 (pp. 22–24).

(List continued on next page.)

*Primary Examiner*—Don Wong
*Assistant Examiner*—Tuan N. Nguyen
(74) *Attorney, Agent, or Firm*—Christie, Parker & Hale, LLP

(57) ABSTRACT

One or more single mode waveguide devices are fiber coupled such that signals to an optical element affect the coupling of the waveguide device to one or more on chip modulators and to an optical fiber. The optical element or additional optical elements are controlled to adjust the coupling of the waveguide device to an on chip modulator and to an optical fiber.

44 Claims, 7 Drawing Sheets

U.S. PATENT DOCUMENTS

| | | | |
|---|---|---|---|
| 5,999,303 | A | 12/1999 | Drake |
| 5,999,545 | A | 12/1999 | Jeon et al. |
| 6,049,554 | A | 4/2000 | Lang et al. |
| 6,078,394 | A | 6/2000 | Wood |
| 6,091,537 | A | 7/2000 | Sun et al. |
| 6,097,860 | A | 8/2000 | Laor .......................... 385/17 |
| 6,133,615 | A | 10/2000 | Guckel et al. |
| 6,150,667 | A | 11/2000 | Ishizaka et al. |
| 6,175,668 | B1 | 1/2001 | Borrelli et al. |
| 6,201,629 | B1 | 3/2001 | McClelland et al. |
| 6,212,151 | B1 | 4/2001 | Heanue et al. |
| 6,227,724 | B1 * | 5/2001 | Verdiell ....................... 385/91 |
| 6,256,328 | B1 | 7/2001 | Delfyett et al. |
| 6,275,315 | B1 | 8/2001 | Park et al. |
| 6,275,317 | B1 * | 8/2001 | Doerr et al. ................ 398/201 |
| 6,295,308 | B1 | 9/2001 | Zah |
| 5,378,330 | A | 1/1995 | Li et al. |
| 5,379,310 | A | 1/1995 | Papen et al. |
| 5,394,489 | A * | 2/1995 | Koch .......................... 385/14 |
| 5,414,540 | A * | 5/1995 | Patel et al. ................. 349/196 |
| 5,420,416 | A | 5/1995 | Iida et al. |
| 5,468,975 | A | 11/1995 | Valster |
| 5,491,576 | A | 2/1996 | Bergano ..................... 398/185 |
| 5,504,609 | A | 4/1996 | Alexander et al. |
| 5,513,030 | A | 4/1996 | Epworth ..................... 398/198 |
| 5,515,196 | A | 5/1996 | Kitajima et al. |
| 5,519,487 | A | 5/1996 | Atwood et al. |
| 5,526,171 | A * | 6/1996 | Warren ....................... 359/285 |
| 5,550,850 | A | 8/1996 | Lee et al. |
| 5,612,968 | A | 3/1997 | Zah |
| 5,629,790 | A | 5/1997 | Neukermans et al. |
| 5,631,735 | A * | 5/1997 | Nagai ......................... 356/330 |
| 5,682,262 | A * | 10/1997 | Wefers et al. ............... 359/305 |
| 5,689,361 | A | 11/1997 | Damen et al. .............. 359/284 |
| 5,715,047 | A | 2/1998 | Adamovsky ................ 356/128 |
| 5,719,650 | A * | 2/1998 | Wefers et al. ................. 349/74 |
| 5,771,253 | A | 6/1998 | Chang-Hasnain et al. |
| 5,777,763 | A | 7/1998 | Tomlinson, III |
| 5,793,912 | A | 8/1998 | Boord et al. ................... 385/37 |
| 5,798,859 | A | 8/1998 | Colbourne et al. |
| 5,825,792 | A | 10/1998 | Villeneuve et al. |
| 5,882,468 | A | 3/1999 | Crockett et al. |
| 5,930,045 | A | 7/1999 | Shirasaki |
| 5,949,544 | A | 9/1999 | Manning |
| 5,953,359 | A | 9/1999 | Yamaguchi et al. |
| 5,959,750 | A * | 9/1999 | Eskildsen et al. ............. 398/92 |
| 6,316,764 | B2 | 11/2001 | Heffner et al. |
| 6,327,063 | B1 | 12/2001 | Rockwell |
| 6,350,064 | B2 | 2/2002 | Mitsuda et al. |
| 6,352,376 | B2 | 3/2002 | Walters et al. |
| 6,433,390 | B1 | 8/2002 | Hara .......................... 257/347 |
| 6,445,670 | B1 | 9/2002 | Oshima .................... 372/29.01 |
| 6,483,969 | B1 * | 11/2002 | Yap et al. ..................... 385/52 |
| 6,516,017 | B1 * | 2/2003 | Matsumoto .................. 372/50 |
| 6,522,793 | B1 * | 2/2003 | Szilagyi et al. ................ 385/2 |
| 6,597,827 | B1 | 7/2003 | Brener et al. ................ 385/18 |
| 6,621,613 | B2 * | 9/2003 | Silberberg et al. .......... 359/239 |
| 2001/0017876 | A1 | 8/2001 | Kner et al. |
| 2001/0036206 | A1 | 11/2001 | Jerman et al. |
| 2001/0050928 | A1 | 12/2001 | Cayrefourcq et al. |
| 2002/0018334 | A1 | 2/2002 | Hill et al. .................... 361/278 |
| 2002/0064192 | A1 | 5/2002 | Missey et al. |
| 2002/0076480 | A1 | 6/2002 | Hsieh et al. |
| 2002/0141690 | A1 | 10/2002 | Jin et al. ...................... 385/18 |
| 2002/0154376 | A1 | 10/2002 | Vail et al. ................... 359/238 |
| 2002/0171901 | A1 | 11/2002 | Bernstein .................... 359/199 |

OTHER PUBLICATIONS

Gordon, C., "Hybrid Mode–Locked DBR–laser", Multidisciplinary Optical Switching Technology Center, http://www.ece.ucsb.edu/MOST/33.html, (last updated Jan. 22, 1996), printed Aug. 5, 2001 (3 pages).

Daneman, M. J., et al., "Laser–to–Fiber Coupling Module Using a Micromachined Alignment Mirror", IEEE Photonics Technology Letters, vol. 8, No. 3, Mar. 1996 (pp. 396–398).

Wu, M., "Micromachining for Optical and Optoelectronic Systems", Proceedings of the IEEE, vol. 85, No. 11, Nov. 1997 (pp. 1833, 1943–1952).

Jacques, S., "Phase conjugate mirror and diffraction grating yield stable, collimated, coherent, high–power diode laser.", Oregon Medical Laser Center Newsletter, http://omlc.ogi.edu/news/dec97/pclaser.html, printed Apr. 9, 2001, (2 pages).

Shirasaki, M., "Chromatic Dispersion Compensator Using Virtually Imaged Phased Array", IEEE Photonics Technology Letters, vol. 9, No. 12, Dec. 1997 (pp. 1598–1600).

Kudo, K., et al., "Multiwavelength microarray semiconductor lasers", Electronics Letters, vol. 34, No. 21, Oct. 15, 1998, (pp. 2037–2039).

Kopka, P., et al., "Bistable 2×2 and Multistable 1×4 Micromechnical Fibre–optic Switches on Silicon", Micro Opto Electro Mechanical Systems, MOEMS 1999 (4 pages).

Sahlén, O., "DWDM lasers fashion networks of the future", FibreSystems, Sep. 1999 (pp. 41–44).

"(BW)(Oh–Marconi–Comm–2) Marconi Communications Announces World–Beating Commercial Tuneable Laser at Telecom '99", Press Release, http://www.businesswire.com/cgi–bin/ts_headline.sh?/bw.101199/192842212, Oct. 11, 1999, printed Oct. 17, 2000 (2 pages).

Maluf, N., "Optical switches", An Introduction to Microelectromechanical Systems Engineering, 2000, pp. 187–190 (3 pages).

Nakano, H., "Technological Trends of Optical Communication Devices for DWDM", NEC Device Technology International 2000, No. 59 (5 pages).

Liu, F., et al., "Cost–effective wavelength selectable light source using DFB fibre laser array", Electronics Letters, vol. 36, No. 7, Mar. 30, 2000, pp. 620–621, (3 pages).

Hunwicks, A., "Advancing the Optical Component", http://www.telecoms–mag.com/issues/200004/tci/advancing-.html, Apr. 2000, printed Oct. 17, 2000 (6 pages).

Pezeshki, B., et al., "12nm tunable WDM source using an integrated laser array", Electronics Letters, vol. 36, No. 9, Apr. 27, 2000 (pp. 788–789).

Howe, P., "Light fantastic", digitalMASS at Boston.com, http://digitalmass.boston.com/news/daily/05/22/light_fantastic.html, printed Oct. 17, 2000 (5 pages).

Silverman, S., "Vcs beam big bucks at optics upstarts", Redherring,com, Oct. 9, 2000, http://www.redherring.com/vc/2000/1009/vc–optics100900.html?id=yahoo, printed Oct. 10, 2000 (5 pages).

International Search Report mailed Jul. 31, 2002 in connection with International Application No. PCT/US02/10377, filed Apr. 1, 2002 (3 pages).

Office Action for U.S. application No. 10/114,746, filed Apr. 1, 2002, inventor Edward C. Vail entitled "Modulator Alignment for Laser", mailed Aug. 25, 2003 (12 pages).

* cited by examiner

ALIGNMENT OF AN ON CHIP MODULATOR

CROSS-REFERENCE TO RELATED APPLICATIONS

This application claims the benefit of U.S. provisional application No. 60/280,207, filed Mar. 30, 2001, which is hereby incorporated by reference as if set forth in full herein.

BACKGROUND

The present invention relates generally to lasers and in particular to controlling fiber coupling between a laser, an on chip modulator and an optical output.

Tremendous amounts of data can be transmitted quickly across a fiber optic or free space link using lasers. This is typically accomplished by modulating the lasers. In one technique, a single laser is turned on continuously and a modulator is used to modulate the light with an input data signal. Using an external modulator rather than changing the intensity of the laser directly leads to reduced parasitic FM modulation or chirp of the signal.

Additionally, coupling the light from the laser, to the modulator, and then to the output fiber, and making sure that this tight coupling is maintained through life of a transmitter is challenging and adds to the cost of such transmitters. In general, any fiber coupling is a costly and time consuming process, on account of the very small optical modes in single mode waveguide devices. Thus, very tight submicron tolerances are often required in the packaging. Typically, when the fiber coupling is maximized, the optical elements are permanently fixed in position. The process is often not very reproducible due to contraction in epoxies or thermal expansion of the components.

Integrated electro-absorption modulators have been very successful recently for a range of medium performance applications. Compared to directly modulated lasers, they have considerably reduced chirp and can be used for longer distance communications. However, the feedback between the integrated modulator and the laser induces, sometimes, unacceptable amounts of chirp for the most demanding applications.

BRIEF SUMMARY OF THE INVENTION

The present invention provides an adjustable optical coupling systems and methods for tunable lasers and on-chip modulators. In one aspect of the invention, one or more lasers are provided on a chip with one or more modulators. One or more optical elements are also provided, such that light from a laser is directed into a modulator by at least one optical element. In another aspect of the invention, a controller is also provided and is coupled to the at least one optical element and configured to adjust the at least one optical element to maximize output power of the light directed into the at least one modulator. In yet another aspect of the invention, another at least one optical element is provided and also an optical output, such that light from a modulator is directed into the optical output by the other at least one optical element.

In a further aspect of the invention, another at least one optical element is provided between the laser or lasers and the modulator or modulators. The optical element is a faraday rotator, in one instance, and an eighth-wave plate, in another. In one aspect of the invention, a polarizer is also provided between the at least one laser and the at least one mirror. In another aspect of the invention, the one or more modulators are fabricated without using selective area growth.

Also, in one aspect of the invention, emitting means for emitting light and modulation means coupled to the emitting means are provided. Furthermore, optical means for directing light having a particular wavelength from the emitting means into the modulation means is also provided. In another aspect of the invention, control means coupled to the optical means and for adjusting the optical means to maximize output power of the light directed into the modulation means is also provided.

Additionally, in another aspect of the invention, a process is provided in which at least one laser on a chip is selected. The at least one laser emits light. Also, an optical path from the selected laser to at least one modulator on the chip is established and the optical path is adjusted to adjust output power to and from the at least one modulator. Also, in one aspect of the invention, the at least one modulator is selected from an array of modulators based on the laser selected and/or on a specific chirp value.

Many of the attendant features of this invention will be more readily appreciated as the same becomes better understood by reference to the following detailed description and considered in connection with the accompanying drawings.

DETAILED DESCRIPTION

DETAILED DESCRIPTION

Figure 1:
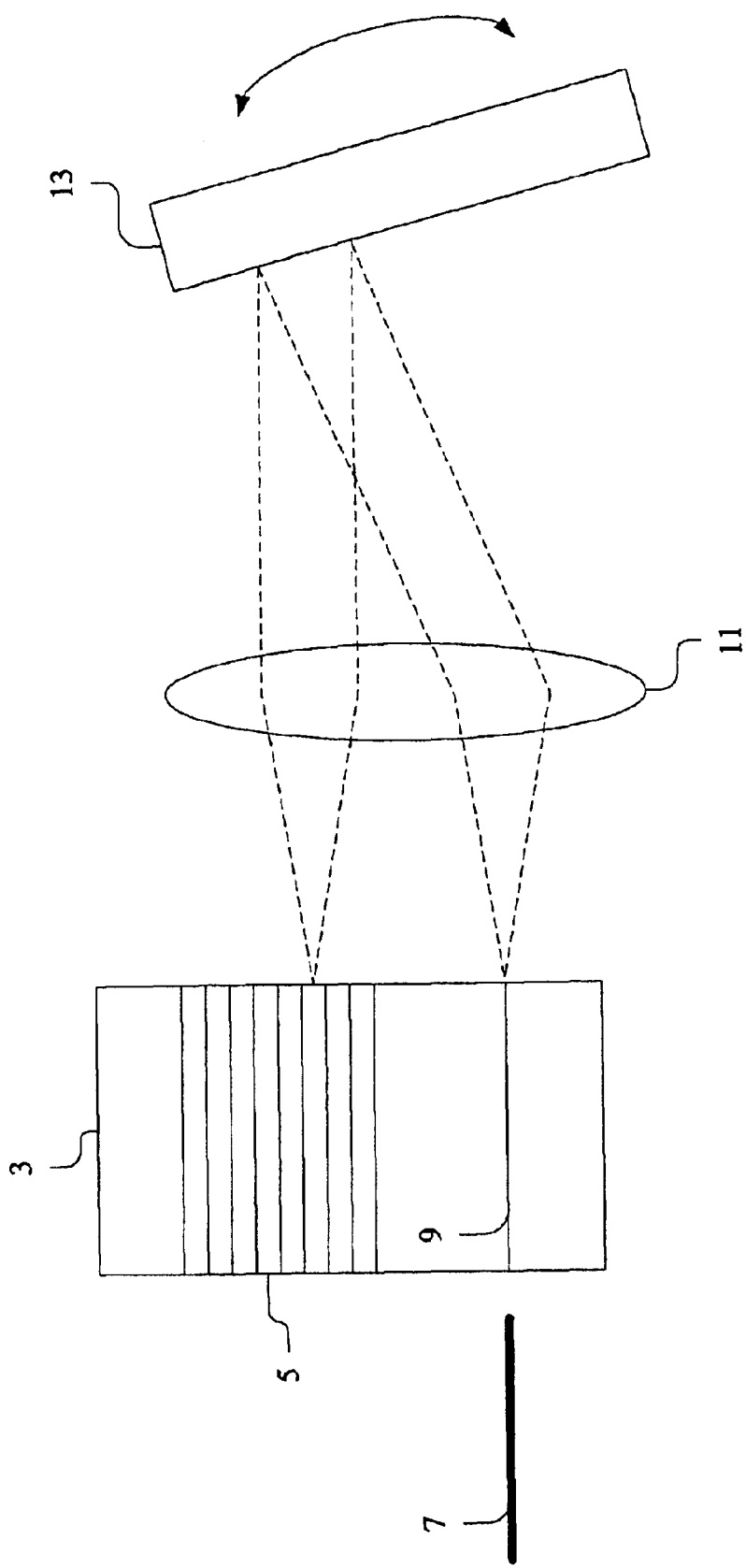
FIG. 1 illustrates a semi-schematic diagram of one embodiment of a modulation system.

In FIG. 1, a laser array 3 includes a number of individual addressable lasers 5. Each laser is designed to operate at a different lasing wavelength, by, for example, varying the grating pitch in the laser or adjusting the effective index of the optical mode through varying the stripe width or the thickness of the layers that compose the laser. Light from a selected laser is optically coupled, i.e., transmitted to an optical output, e.g., an optical fiber 7. Various structures and controls are available, examples of which are described in U.S. patent application Nos. 10/000,142 and 10/002,703, the disclosures of which are hereby incorporated by reference. In one embodiment, a single laser is utilized instead of a laser array 3. As such, the following description applies as appropriately to the case where the array size is one.

A modulator 9 is included or integrated on the same chip as the laser array. In the embodiment shown, the modulator is not directly coupled to any one of the lasers on chip, but optical coupling between the modulator and the laser occurs external to the chip. A laser is selected from the laser array and emits light. The light is collimated by a lens 11 and strikes a movable mirror 13, e.g., a MEMs tilt mirror. The light is reflected by the movable mirror 13 back to the lens 11. The lens 11 focuses the light into the modulator 9. The modulator causes the intensity of the light to change in accordance with input data 19 and supplies the modulated light to an optical output 7.

As shown in FIG. 1, the total number of components utilized can be minimal and thus the number of chips and lenses used is reduced. Additionally, the tolerances to which those different components or parts are placed are also reduced. In one embodiment, the modulator is an electroabsorption modulator. Electroabsorption modulators have the same mode size as a lens array, and thus there are no losses due to mismatched modes using a lens system with magnification of 1. In this embodiment, the optical output is a lensed optical fiber or a lensed fiber coupled to an optical fiber and is used to match the electroabsorption modulator mode to the fiber mode. The reverse current on the electroabsorption modulator is used to monitor the fiber-coupled power and to optimize coupling of the light from the selected laser into the optical output. In one embodiment, a separate lens train is used to couple light from the modulator to the output fiber. The separate lens train allows a free space isolator to be added after the modulator. The free space isolator, for example, is used to prevent reflections from facets after the modulator from reflecting light back into the laser.

The modulator could also be an electro-refractive waveguide modulator, such as a Mach-Zehnder or a directional coupler modulator, where changes in refractive index are used to vary the intensity interferometrically. In such cases, waveguide taps and reverse biased detectors can be implemented to monitor the optical power coupled to the modulator and used to optimize the mirror position. Alternatively, in the same way that the MEMs mirror can select one element out of an array, more than one modulator can be integrated on a chip. The other modulators in the array may have different bandgaps and be optimized for different wavelength ranges. Thus when the electronic control selects a specific laser, of a specific wavelength, it may also select a modulator whose properties are optimum for that wavelength. Similarly, the modulators may vary in their chirp performance. Thus a modulator may be selected that has the proper chirp value required by the system.

Modulators can be integrated with lasers using a number of processing techniques. Generally the bandgap of the modulator region has to be varied such that the laser wavelength is just above the bandedge of the modulator. When the modulator is reverse biased, the bandedge shrinks either through the Franz-Keldysh effect, in the case of bulk material, or through the quantum confined Stark effect, in the case of quantum well material. In both cases, the absorption increases and the light transmission is reduced. Similarly electro-refractive modulators can be integrated with a laser on the same chip. In these modulators the absorption change is minimal, and the main component is a change in the refractive index. Directional coupler or Mach-Zehnder configurations convert the change in index to one of intensity. The same techniques of selective area growth or etch and regrowth can be used to make optimal waveguide on the chip for the modulator.

A modulator may be fabricated on the same chip as the lasers by utilizing selective area growth. In this case the quantum wells of the lasers and the modulator are fabricated in the same epitaxial step, but with a dielectric mask present on the wafer during the growth. The mask would have wider regions around the laser opening than it would around the modulator opening, thus creating thicker quantum wells in the laser than in the modulator. The wider quantum wells of the laser cause the bandgap to be lower in energy than in the modulator, and thus the modulator would be largely transparent at the lasing wavelength with no reverse bias. As the voltage is increased, the bandgap of the modulator would shrink, and the absorption increases correspondingly to vary the output intensity.

Figure 2:
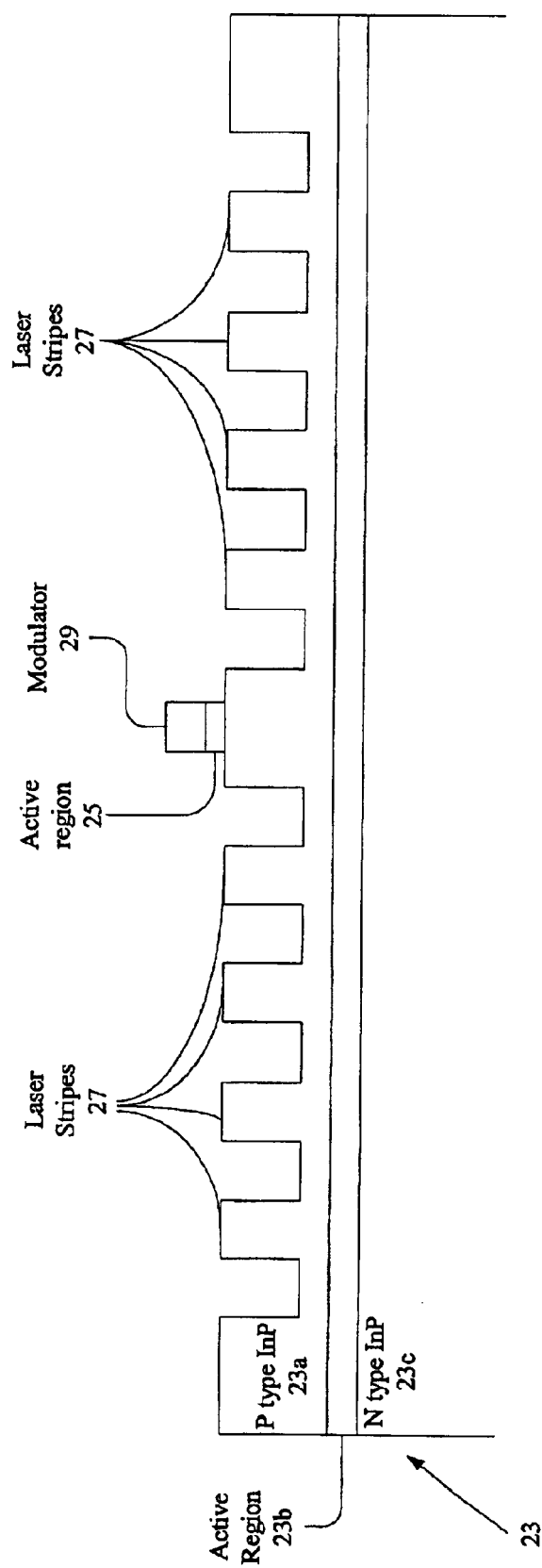
FIG. 2 illustrates a structural diagram of one embodiment of a laser array and a modulator fabricated on the same chip.

FIG. 2 illustrates one embodiment of a modulator structure integrated on chip with a laser array that does not require selective area growth. As mentioned, providing or integrating an electroabsorption modulator on the same chip of the laser array, sometimes, requires a different set of epitaxial layers. As such, etching off of laser layers and regrowing, or using various selective epitaxial growth techniques to vary the composition of the epitaxial layers is performed to incorporate a modulator on the chip of the laser array. However, as shown in FIG. 2, an electroabsorption modulator layer structure 21 is grown on top of a regular laser structure 23 to form an NPN structure. A P type layer 23a, an active region layer 23b and an N type layer forms the laser structure 23. The modulator is placed or grown on a QW active region 25 and between the lasers 27 on the laser array. As such, a modulator grown on the top of the laser structure is accomplished without having to use the more difficult growth techniques and thus the integrated laser array and modulator chip is fabricated using standard processing techniques.

Figure 3:
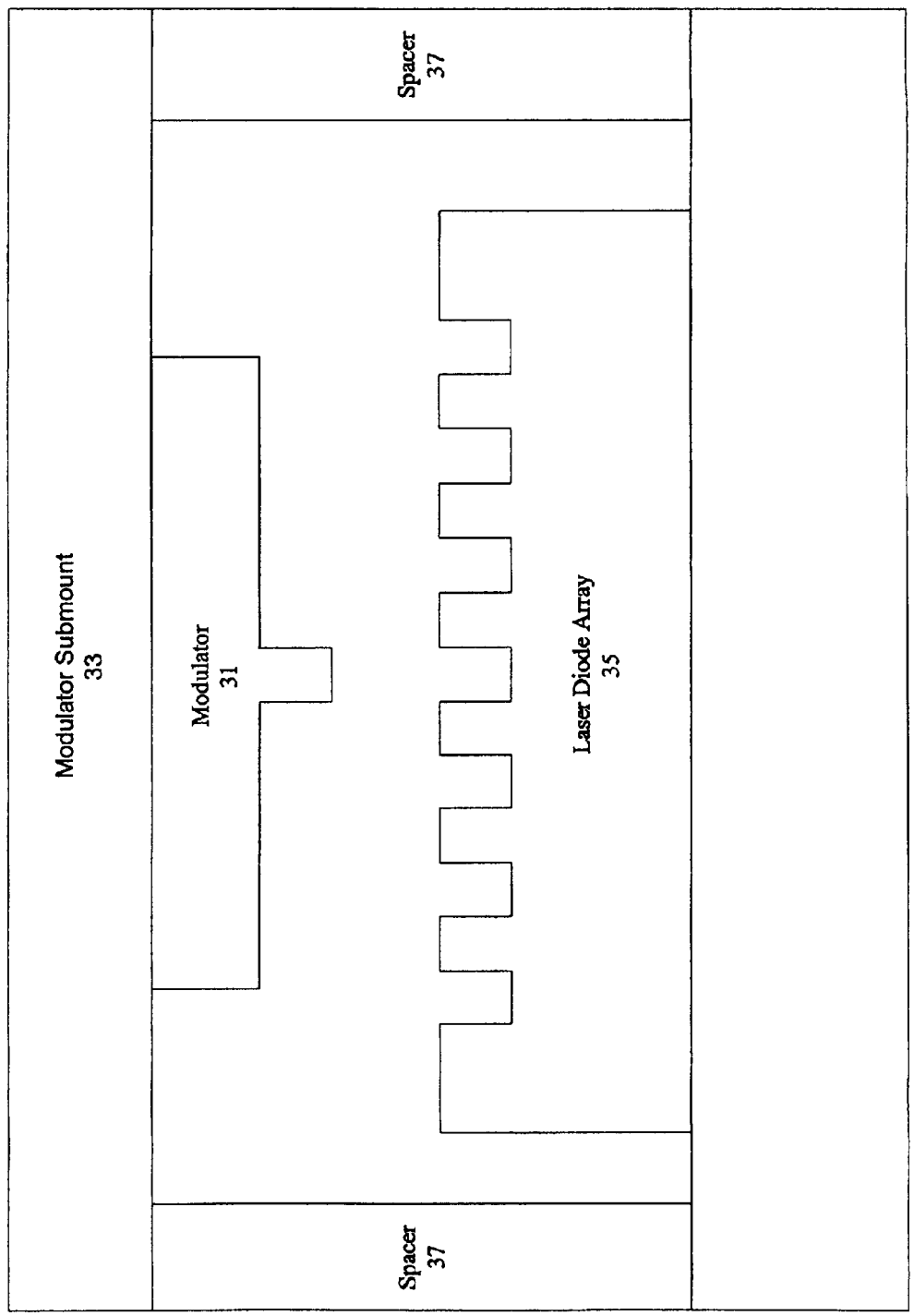
FIG. 3 illustrates a structural diagram of one embodiment of a modulator flipped onto a laser array.

In FIG. 3, a modulator 31, such as an electroabsorption modulator, including the modulator submount 33 is fabricated on a separate chip. The laser array 35 is also fabricated on a separate chip. The chips are mounted one on top of the other with spacers 37 placed between the two chips. Such a mounting, in embodiment, is performed after wirebonding from the chips to the submount has been completed and by using wrap around metallization on the modulator submount to bring wire bonding bads to the top surface for submount to package wirebonding. The components are soldered together using standard die bonding equipment or jigs in reflow ovens.

As such, in the embodiment shown in FIG. 3, a modulator is incorporated on chip with a laser array but in a vertical direction. Thus, the view of FIG. 3 is from the front of the laser array with an integrated modulator chip. With the modulator positioned within a hundred microns of the laser array, the above describe structure enables light from a laser from the laser array to reflected back by a mirror and directed into the modulator, as described in FIG. 1.

Figure 4:
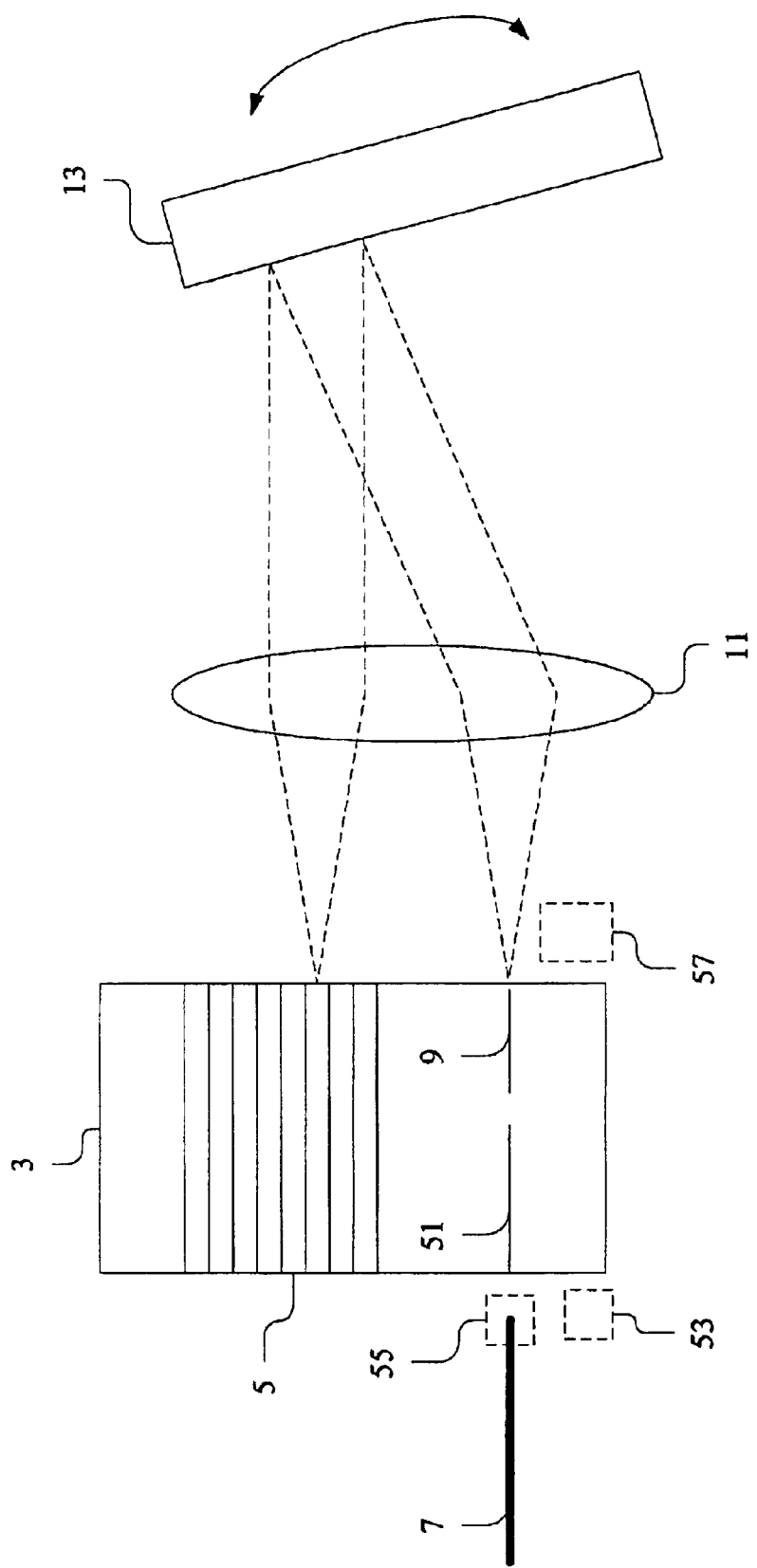
FIG. 4 illustrates a semi-schematic diagram of one embodiment of a modulation system.

In FIG. 4, a semiconductor optical amplifier 51 is incorporated or integrated on the laser array 5. The optical amplifier is placed in series with the modulator, i.e., after the modulator 9 and before the optical output 7. The optical amplifier boosts the output power from the modulator. Accordingly, light is emitted from a selected laser 5 from the laser array 3 and is collimated by a lens 11. The light strikes a movable mirror 13 which reflects the light back to the lens 11. The lens focuses the light into the modulator 9 and is provided to the amplifier 51 that boosts power of the light before providing the light to the optical output. The amplifier, however, in one embodiment, having a nonlinear and power dependent gain, may distort some waveforms of the light from the modulator. However, for some applications, such as those use return to zero (RZ) waveforms and/or particular transmission rates, these distortions are may be acceptable.

In one embodiment, a detector 53 is placed after the modulator, such as through a splitter, to monitor or detect the coupled power. In another embodiment, a detector 55 inline with the optical output, such as with a tap, is provided for monitoring the optical power of the light from the modulator. In one embodiment, a detector 57 is also placed proximate or with the modulator. As such, the detector measures how much power is coupled into the modulator. The output from a detector such as described above provides feedback for the movable mirror to move and maintain optimal coupling of the selected laser to the modulator and/or to the optical output.

Figure 5:
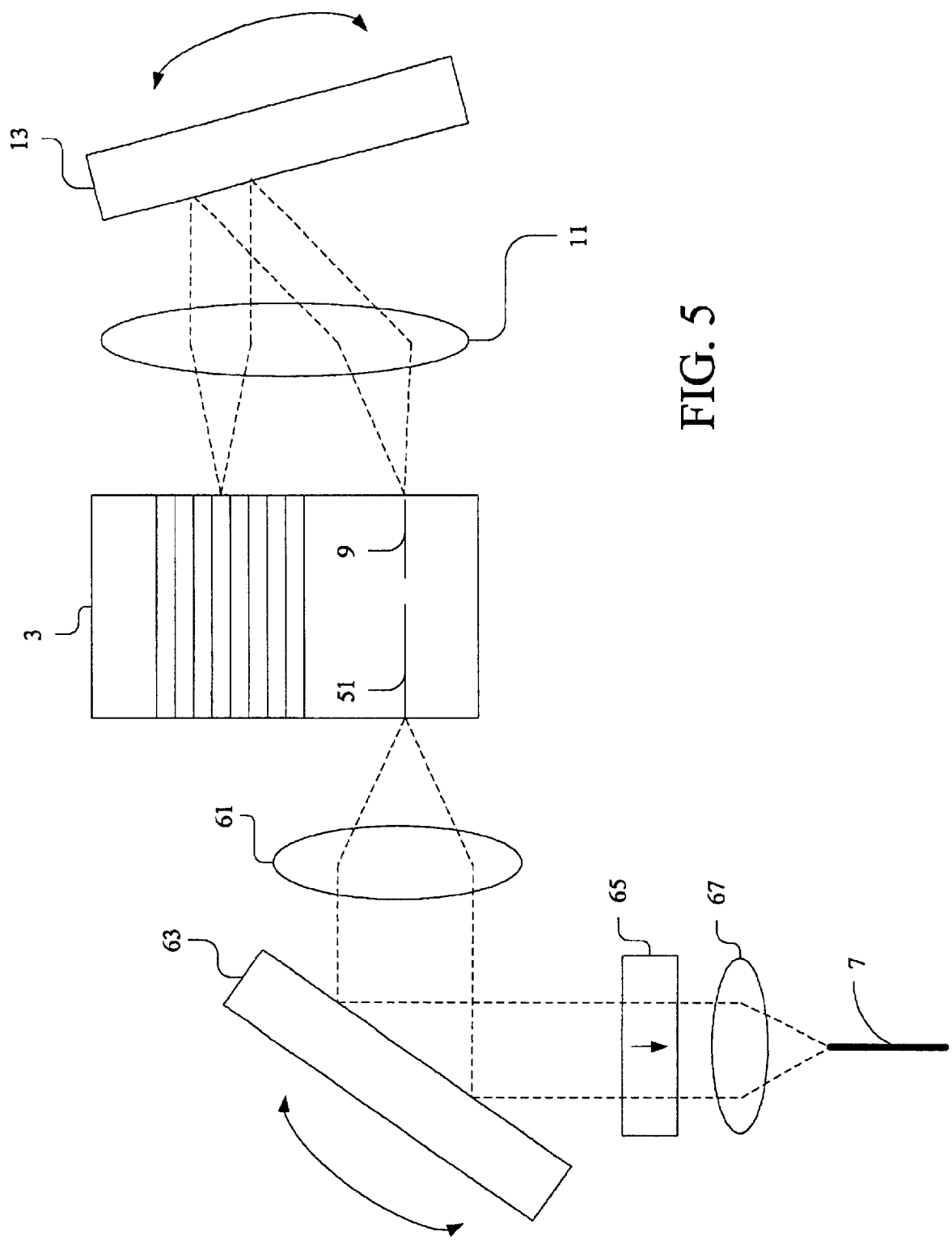
FIG. 5 illustrates a semi-schematic diagram of another embodiment of a modulation system.

In FIG. 5, another movable mirror 63 is provided along with two lenses 61 and 67. The movable mirror and lenses provides dynamic control of coupling light from the modulator 9 or, in one embodiment, the amplifier 51 into the optical output 7. For instance, a laser is selected from the laser array 3 and emits light which is collimated by lens 11. The movable mirror 13 reflects the light to lens 11 which focuses the light into the modulator 9. The mirror 13 is moved or controlled to optimally or otherwise couple the light from the selected laser into the modulator to maximize output power or balance power to the modulator.

In one embodiment, an amplifier 51 is placed in series with the modulator 9. The amplifier boosts the power of the light from the modulator and is provided to the lens 61. The lens 61 collimates the light which strikes the movable mirror 63. The movable mirror 63 reflects the light to, in one embodiment, an optical isolator 65. The isolator prevents or reduces light from being reflected back to the transmitter. The isolator 65 passes the light to the lens 67. The lens 67 focuses the light into the optical output 7. Similar to the movable mirror 13, the movable mirror 63 is dynamically moved or controlled to optimally or otherwise couple the light from the modulator to the optical output in order to maximize output power or balance power to the optical output.

Figure 6:
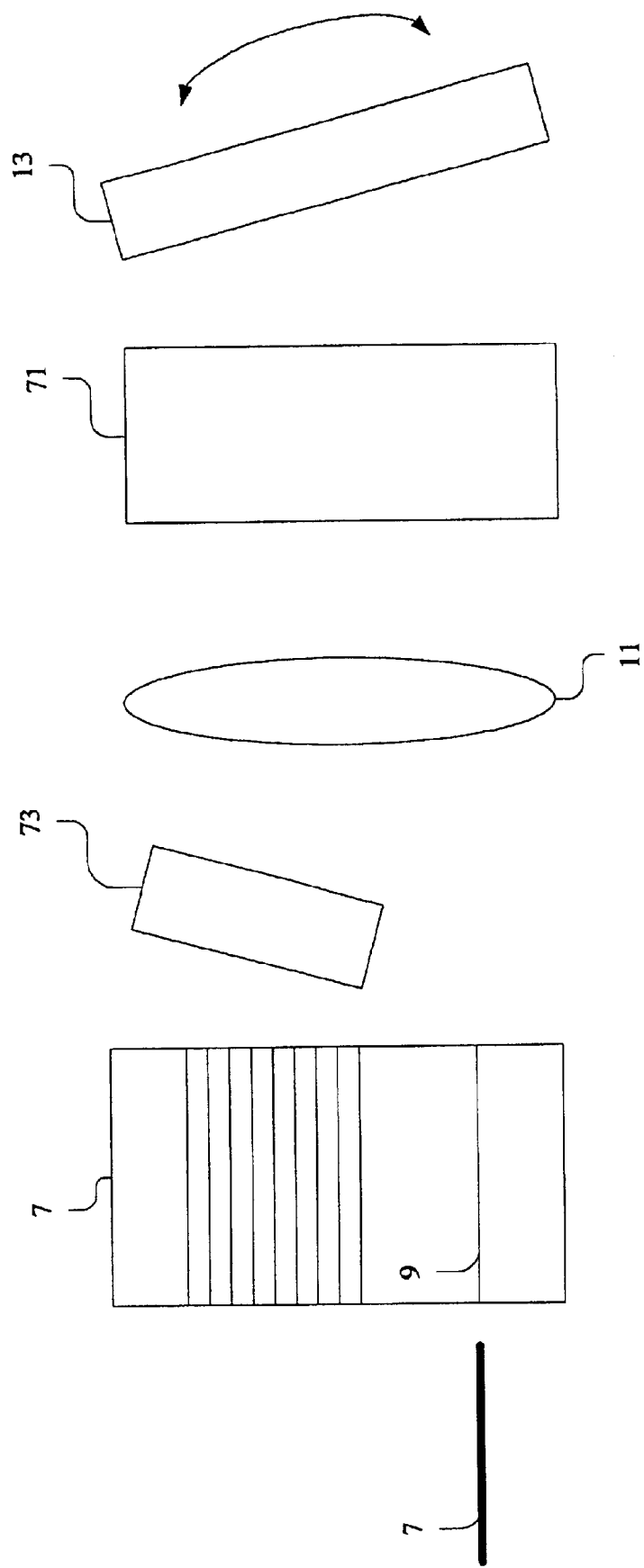
FIG. 6 illustrates a semi-schematic diagram of another embodiment of a modulation system.

As such, the embodiment describe in reference to FIG. 6, reduces the difficulty in coupling the amplifier output to the fiber, since the movable mirror, e.g., a MEMs tilt mirror, reduces the tolerances required during assembly and that are maintained over life of a optical device, e.g., a transmitter. Additionally, the incorporation of an isolator in the output prevents back reflections from distorting the wavelength of the laser.

As such, the modulator is able to be isolated from the laser, and thus parasitic reflections from the modulator into the laser that cause chirp can be reduced or eliminated. A waveplate or a Faraday rotator is sufficient to tremendously reduce the reflections back into the laser and improve chirp performance. Thus, in FIG. 6, an optical element 71, such as an eighth-wave plate or a corresponding Faraday rotator, is placed between lens 11 and movable mirror 13 to prevent or reduce light from being reflected back to the laser in laser array 3. Thus, the optical element is able to reduce the feedback induced chirp.

Lasers, in one embodiment, operate linearly polarized. The TE polarized light from the laser is converted to elliptically polarized through the optical element 71, e.g., a waveplate. The beam from the light hits the mirror 13 and passes again through the optical element, becoming circularly polarized. The light is then coupled to the modulator and the majority of the signal passes to the fiber. The electro-absorption modulator is configured to be relatively polarization independent, such that its performance is not seriously compromised by having circularly polarized light entering the device. Any light that comes back from the modulator and is reflected back to the laser passes through the optical element two more times and becomes linearly polarized in the other axis (TM polarization) and thus has a negligible effect on the laser.

In another embodiment, another optical element 73, such as a linear polarizer matched to the TE laser mode, is added to completely eliminate or significantly reduce the feedback. For example, the polarizer would absorb any TM component in the parasitic feedback. Where the optical element 71 is a Faraday rotator, the operation is similar, except rather than the intermediate elliptically and circularly polarized beams, the light stays linearly polarized, but the polarization vector is rotated by $\pi/8$ and $\pi/4$ respectively..

Similar to the other previously described embodiments, the movable mirror 13 and lens 11 provides dynamic control of coupling the light from a laser to the modulator 9 and into the optical output 7 including through the optical element 73, e.g., polarizer 73, and the optical element 71, e.g., a waveplate.

The mirror 13, in all the embodiments described, can also be used as a variable optical attenuator (VOA). If the system requires less intensity from the transmitter, the mirror position can be moved away from, for example, the optimal coupling position to reduce the amount of light entering the modulator. The amount of of-axis motion is controlled either open loop, through a previously measured look-up table in the electronics control, or actively in a negative feedback loop by monitoring the average reverse-bias current of the modulator, or through an appropriate tap, as previously described. With the mirror acting as a VOA, the same voltage levels can be applied to the modulator and the same current to the laser, thus there is no change in the spectral quality of the light, or the extinction coefficient of the modulator. The additional degree of freedom afforded by the mirror can thus be used to eliminate an external VOA used in some systems to balance the powers in different wavelength channels.

Figure 7:
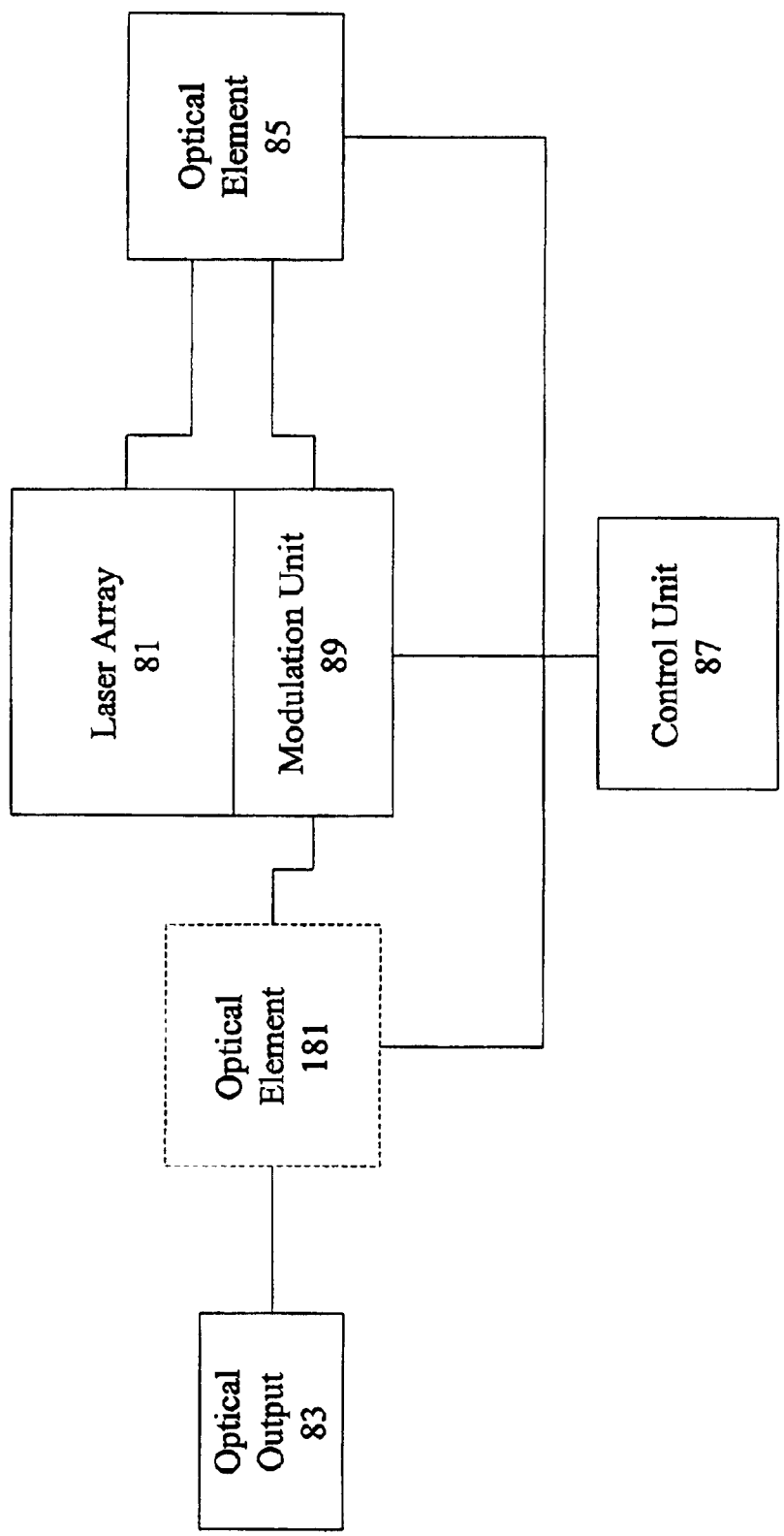
FIG. 7 illustrates a block diagram of one embodiment of a modulation system.

In FIG. 7, a laser is selected from an array of lasers 81 with different wavelengths and is used to increase the tuning range of an output signal. As such, a laser close to the desired wavelength is turned on and then fine-tuned to the desired wavelength using, for example, thermal tuning. In this way wide tuning can be achieved with the excellent performance of narrow tuning structures. The output from a laser of the multiple lasers is coupled to an optical output 83, e.g., a single optical fiber, using an optical element 85 and a control unit 87 or controller. For instance, the optical element is controlled by the control unit using active techniques such as MEMS, thermo-optic, liquid crystal, and others, or passive techniques such as couplers, combiners, and others, which can be integrated along with the laser array.

Additionally, a modulation unit 89 is integrated into the laser array and before the optical output to modulate the laser in order to transmit data. The modulation unit includes one or more modulators, such as an electroabsorption, lithium niobate, or InP electro-refractive devices. In one embodiment, the controller selects a modulator based on which the laser is selected. As such, in one embodiment, the controller selects the modulator by manipulating the optical element to direct light from the selected laser to the selected modulation. Additionally, similar to manipulating the optical element to optimally optically couple a laser to the optical output, the controller also manipulates the optical element to ensure optimal coupling between the laser and the modulator and the modulator to the optical output. In one embodiment, a second optical element 181 is also provided and controlled by the controller to further ensure optimal optical coupling of light from the modulator to the optical output.

There are a number of possible configurations and the control thereof of coupling of light from a laser to the modulation unit and the light from the modulation unit to the optical output, some of which are describe above. These configurations compensate for errors in the fiber alignment and loosen the tolerances for the initial placement of parts. Additional configurations and controls to provide optimal coupling of the laser to the optical output are also described in U.S. patent application Nos. 10/000,142 and 10/002,703, the disclosures of which are hereby incorporated by reference, and can be utilized to provide optimal coupling of the light from the laser to the optical output in accordance with the above description. Likewise, these configurations and the controls can be also utilized to provide optimal coupling of the light from the laser to an optical output which is a modulation unit integrated with the laser array and an optical fiber or waveguide.

Accordingly, the present invention provides a system and methodology for controlling and optimizing fiber coupling between tunable lasers and a on chip modulator and to an optical output. Although this invention has been described in certain specific embodiments, many additional modifications and variations would be apparent to one skilled in the art. It is therefore to be understood that this invention may be practiced otherwise than is specifically described. Thus, the present embodiments of the invention should be considered in all respects as illustrative and not restrictive. The scope of the invention to be indicated by the appended claims, their equivalents, and claims supported by this specification rather than the foregoing description.

What is claimed is:

1. An optical transmission apparatus comprising:
   at least one laser provided on a chip;
   at least one optical element provided off the chip; and
   at least one modulator provided on the same chip as the at least one laser, such that light from the at least one laser is reflected back directly to the at least one modulator on the same chip as the at least one laser by the at least one optical element.

2. The apparatus of claim 1 further comprising a controller coupled to the at least one optical element and configured to adjust position of the at least one optical element to adjust output power of the light directed into the at least one modulator based on an amount of light directed into the at least one modulator.

3. The apparatus of claim 2 wherein the at least one modulator comprises an electroabsorption modulator.

4. The apparatus of claim 3 further comprising at least one current detector coupled to the at least one modulator; and
   wherein the controller is configured to adjust the position of the at least one optical element based on reverse bias current through the at least one current detector.

5. The apparatus of claim 2 further comprising an optical output and at least one detector proximate the optical output; and
   wherein the controller is configured to adjust the position of the at least one optical element based on the optical power determined by the at least one detector.

6. The apparatus of claim 2 further comprising at least one detector proximate the at least one modulator; and
   wherein the controller is configured to adjust the position of the at least one optical element based on the optical power determined by the at least one detector.

7. The apparatus of claim 2 further comprising:
   a second at least one optical element; and
   an optical output, such that light from the at least one modulator is directed into the optical output by the second at least one optical element.

8. The apparatus of claim 7 further comprising at least one detector proximate the optical output; and
   wherein the controller is configured to adjust the position of the at least one optical element based on the optical power determined by the at least one detector.

9. The apparatus of claim 8 wherein the second at least one optical element comprises a movable mirror.

10. The apparatus of claim 2 wherein the at least one optical element comprises a movable mirror.

11. The apparatus of claim 2 further comprising a third at least one optical element between the at least one laser and the at least one modulator.

12. The apparatus of claim 11 wherein the third at least one optical element is a faraday rotator.

13. The apparatus of claim 12 wherein the third at least one optical element is an eighth-wave plate.

14. The apparatus of claim 12 further comprising:
   polarizer between the at least one laser and the at least one mirror.

15. The apparatus of claim 2 wherein the at least optical element comprises at least one focus lens between the array of lasers and the at least one modulator.

16. The apparatus of claim 7 wherein the second at least optical element comprises at least one focus lens between the at least one modulator and the optical output.

17. The apparatus of claim 2 wherein the optical output comprises a fiber.

18. The apparatus of claim 2 wherein the at least one modulator is positioned above the at least one laser.

19. The apparatus of claim 2 wherein the at least one modulator is positioned adjacent to the at least one laser.

20. The apparatus of claim 2 wherein the at least one modulator is fabricated without using selective area growth.

21. The apparatus of claim 2 wherein the at least one modulator is fabricated on a submount and coupled on top of the chip with the at least one laser.

22. The apparatus of claim 2 wherein the at least one laser comprises a p type, a first active region and a n type material and further comprising a second active region placed on the p type material and the at least one modulator is placed on the second active region.

23. An optical transmission control apparatus comprising:
   emitting means for emitting light on the chip;
   modulation means coupled to the emitting means on the same chip as the emitting means; and
   optical means, being off the chip, for reflecting back light having a particular wavelength from the emitting means directly to the modulation means on the same chip as the emitting means.

24. The apparatus of claim 23 further comprising control means coupled to the optical means and for adjusting position of the optical means to adjust output power of the light directed into the modulation means based on an amount of light directed into the modulation means.

25. The apparatus of claim 24 further comprising an output means; and
   wherein the optical means directs light from the emitting means to the output means through the modulation means.

26. The apparatus of claim 25 further comprising sensing means for sensing light and is proximate the output means; and
   wherein the control means is coupled to the sensing means and adjusts the position of the optical means based on light sensed by the sensing means.

27. The apparatus of claim 24 further comprising sensing means for sensing light and is proximate the modulation means; and wherein the control means is coupled to the sensing means and adjusts the position of the optical means based on light sensed by the sensing means.

28. The apparatus of claim 24 further comprising monitoring means for monitoring current in the modulation means; and wherein the control means is coupled to the monitoring means and adjusts the position of the optical means based on current monitored by the monitoring means.

29. An optical transmission method comprising:

selecting at least one laser on a chip, each of the at least one laser emitting light having a particular wavelength;

establishing an optical path from the selected at least one laser to at least one modulator on the same chip as the at least one laser, the optical path being a course taken by the light emitted from the selected at least one laser to reflected back directly to the at least one modulator; and adjusting the optical path to adjust output power of the light emitted from the at least one laser to reflected back directly to the at least one modulator based on an amount of light received by the at least one modulator.

30. The method of claim 29 wherein establishing the optical path further comprises determining a position that causes an at least one optical element to direct light from the selected laser to the at least one modulator; and placing the at least one optical element in the determined position.

31. The method of claim 30 further comprising adjusting the optical path to maximize output power of the emitted light from the selected laser to the at least one modulator based on an amount of light received by the at least one modulator.

32. The method of claim 30 wherein determining a position of the at least one optical element further comprises monitoring a reverse bias current on the at least one modulator to determine the position.

33. The method of claim 30 further comprising adjusting the optical path to balance output power of the emitted light from the selected laser to the at least one modulator based on an amount of light directed into the at least one modulator.

34. The method claim 30 further comprising preventing light from the at least one modulator towards the at least one laser.

35. The method of claim 30 further comprises focusing the emitted light into the at least one modulator.

36. The method of claim 30 further comprising establishing an optical path from the at least one modulator to an optical output, the optical path being a course taken by the light from the at least one modulator to the optical output.

37. The method of claim 36 further comprises focusing light from the at least one modulator to the optical output.

38. The method of claim 36 further comprising adjusting the optical path to adjust output power of light from the at least one modulator to the optical output based on an amount of light directed into the optical output.

39. The method of claim 36 further comprising adjusting the optical path to maximize output power of light from the at least one modulator to the optical output based on an amount of light directed into the optical output.

40. The method of claim 36 wherein adjusting the optical path further comprises:

determining a position that causes a second at least one optical element to direct light from the at least one modulator to the optical output; and placing the second at least one optical element in the determined position.

41. The method of claim 40 further comprises focusing light from the at least one modulator to the optical output.

42. The method of claim 30 further comprises selecting the at least one modulator from an array of modulators.

43. The method of claim 42 wherein selecting the at least one modulator from an array of modulators is based on the laser selected.

44. The method of claim 42 wherein selecting the at least one modulator from an array of modulators is based on a specific chirp value.

* * * * *